(12) United States Patent
Kolb et al.

(10) Patent No.: US 8,415,191 B2
(45) Date of Patent: Apr. 9, 2013

(54) INTEGRALLY FABRICATED MICROMACHINE AND LOGIC ELEMENTS

(75) Inventors: Stefan Kolb, Unterschleissheim (DE); Reinhard Mahnkopf, Oberhaching (DE); Christian Pacha, Munich (DE); Bernhard Winkler, Munich (DE); Werner Weber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/218,987

(22) Filed: Aug. 26, 2011

(65) Prior Publication Data

US 2012/0061777 A1    Mar. 15, 2012

Related U.S. Application Data

(62) Division of application No. 11/863,297, filed on Sep. 28, 2007, now Pat. No. 8,076,738.

(51) Int. Cl.
*H01L 29/84* (2006.01)

(52) U.S. Cl. .................. 438/52; 257/417; 257/E29.324

(58) Field of Classification Search .................. 257/417, 257/E29.324; 438/52
See application file for complete search history.

(56) References Cited

U.S. PATENT DOCUMENTS

| 5,541,437 | A | * | 7/1996 | Watanabe et al. | ............. 257/417 |
| 5,874,675 | A | | 2/1999 | Edmans et al. | |
| 6,204,544 | B1 | | 3/2001 | Wang et al. | |
| 2003/0173611 | A1 | * | 9/2003 | Bertz et al. | ..................... 257/302 |
| 2004/0150029 | A1 | | 8/2004 | Lee | |
| 2005/0130360 | A1 | * | 6/2005 | Zhan et al. | ..................... 438/197 |
| 2005/0227428 | A1 | | 10/2005 | Mihai et al. | |

OTHER PUBLICATIONS

U.S. Appl. No. 11/863,297, filed Sep. 28, 2007, Inventor Kolb et al.

* cited by examiner

*Primary Examiner* — Steven J Fulk
(74) *Attorney, Agent, or Firm* — Patterson Thuente Pedersen, P.A.

(57) ABSTRACT

Embodiments relate to micromachine structures. In one embodiment, a micromachine structure includes a first electrode, a second electrode, and a sensing element. The sensing element is mechanically movable and is disposed intermediate the first and second electrodes and adapted to oscillate between the first and second electrodes. Further, the sensing element includes a FinFET structure having a height and a width, the height being greater than the width.

5 Claims, 11 Drawing Sheets

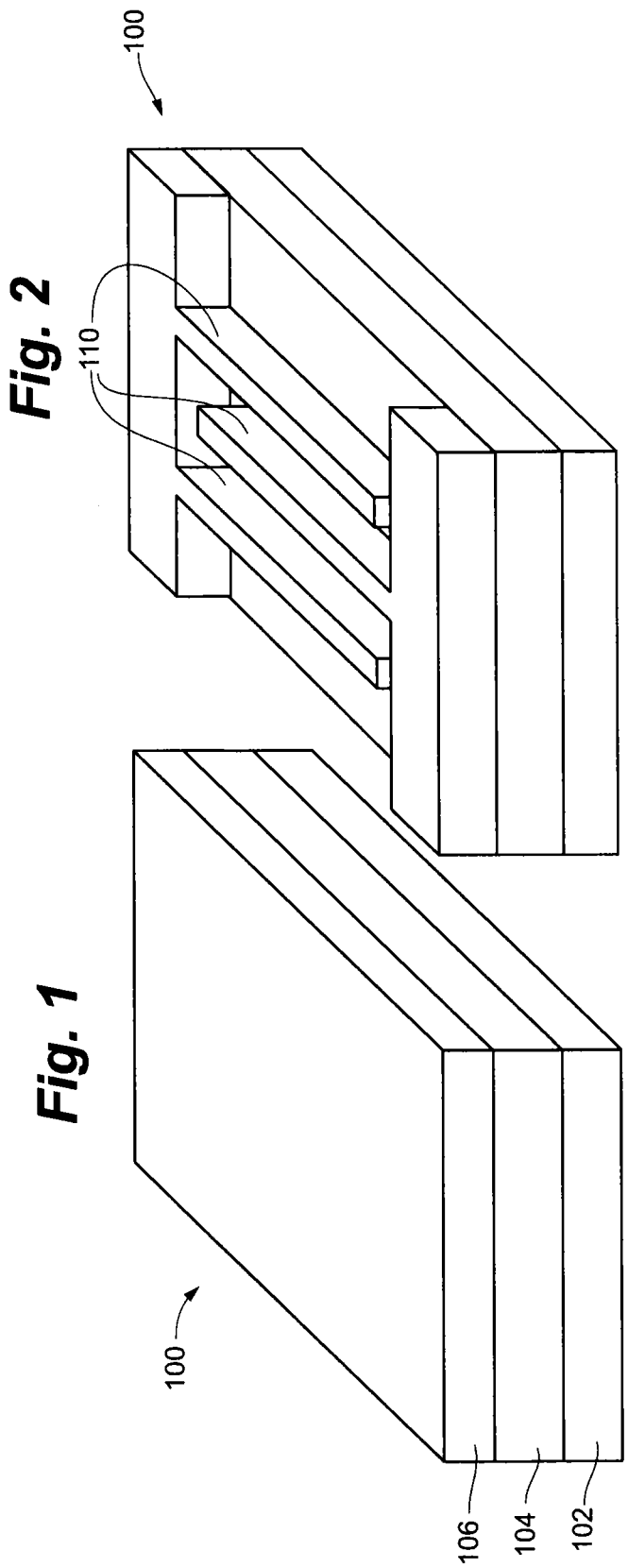

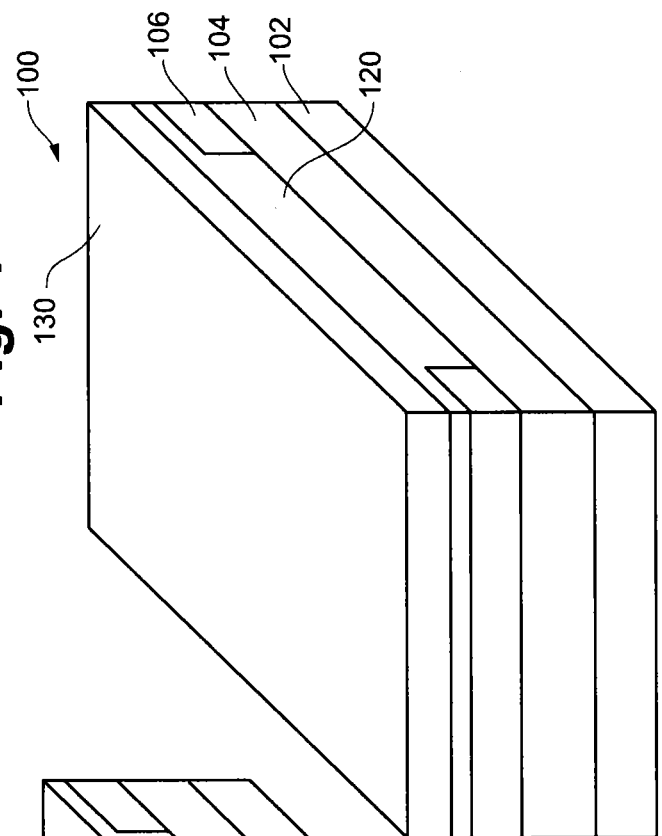
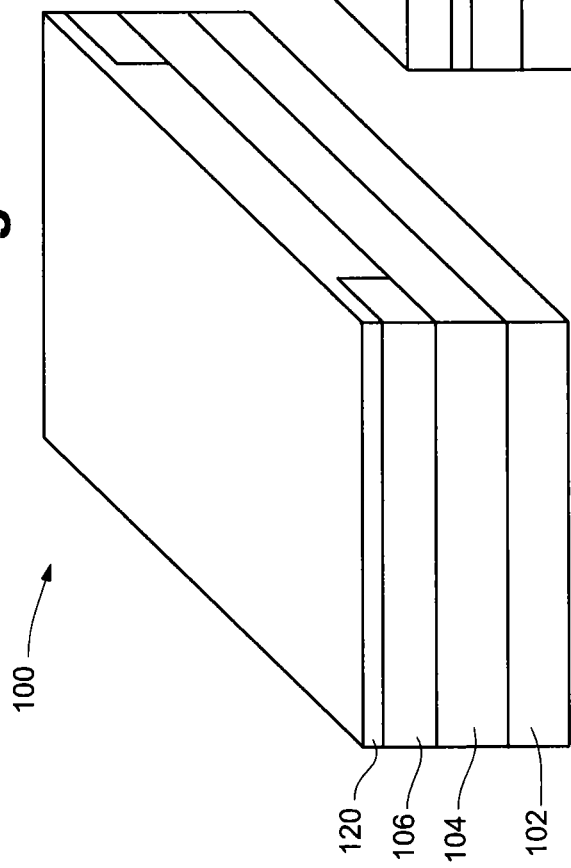

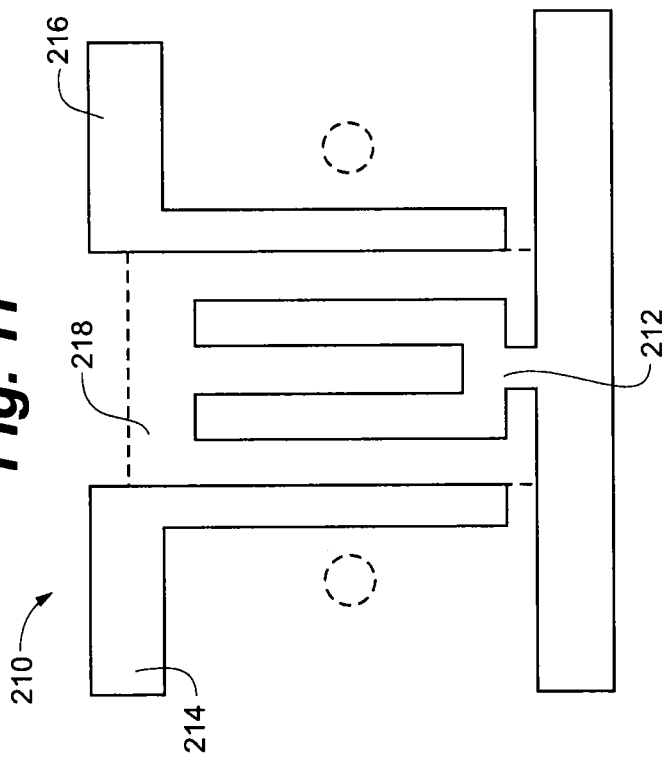
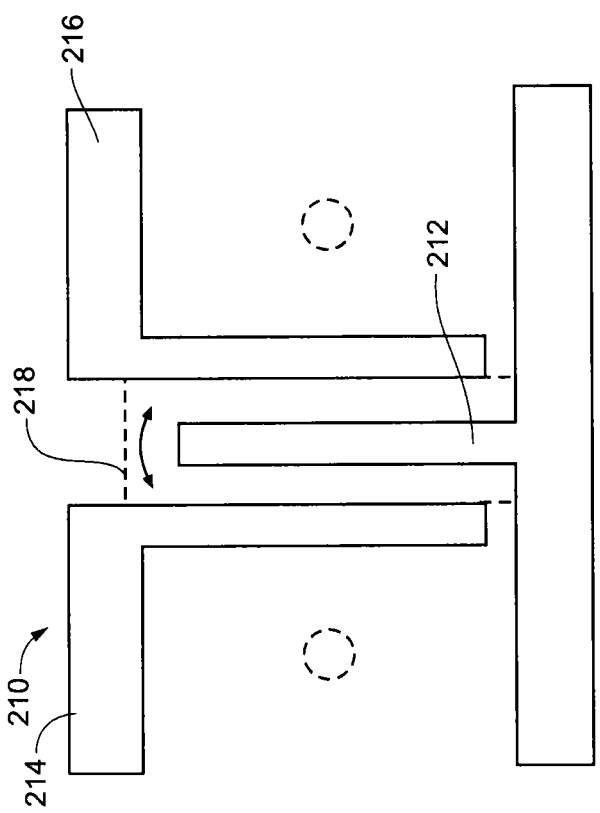

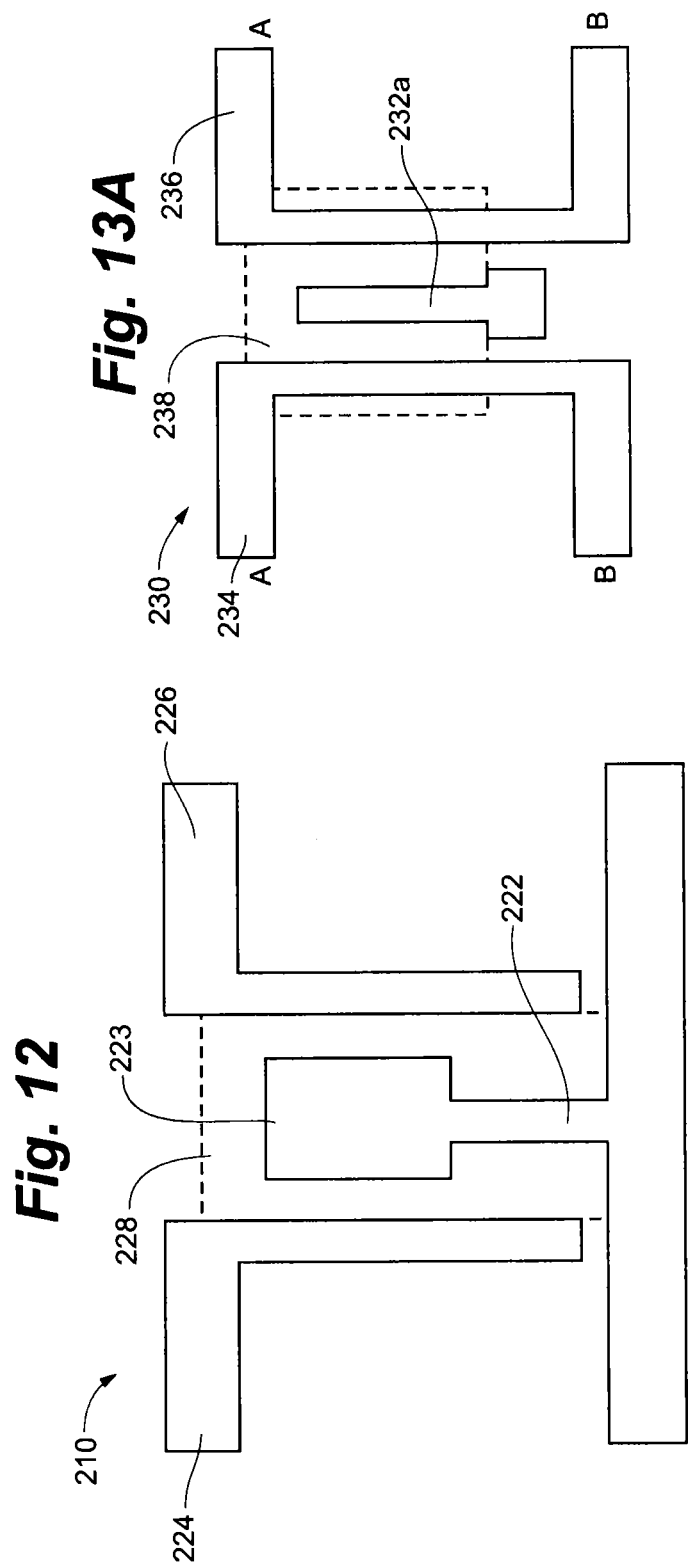

INTEGRALLY FABRICATED MICROMACHINE AND LOGIC ELEMENTS

RELATED APPLICATION

This application is a divisional application of U.S. application Ser. No. 11/863,297 filed Sep. 28, 2007, which is incorporated herein by reference in its entirety.

FIELD OF THE INVENTION

The invention generally relates to micromachine structures. More particularly, the invention relates to micromachine devices having FinFET structures and integrated with CMOS logic.

BACKGROUND OF THE INVENTION

Today most discrete sensor elements in micrometer dimensions are produced with special equipment and special processes. This results in both cost disadvantages and difficulties producing large quantities of high quality devices.

Integrated sensor systems implemented in 0.5-micrometer (um) logic are known. In such integrated systems, the sensor element is manufactured in a separate process block. This also results in cost disadvantages. Further, the structure size and high mechanical sensitivity result in reduced robustness of the sensors in subsequent processing, treatment, and testing. For example, electrostatic forces can be used in testing. As a result of the structure size, however, required voltages are in the range of 5 volts (V) to 30V, incompatible with voltages in corresponding logic processes and resulting in undesirable high current consumption.

SUMMARY

Embodiments of the invention are related to micromachine structures.

In an embodiment, a micromachine structure comprises a first electrode; a second electrode; and a mechanically movable sensing element disposed intermediate the first and second electrodes and adapted to oscillate between the first and second electrodes, the sensing element comprising a forked fin FinFET structure having a height and a width, the height being greater than the width.

In an embodiment, a micromachine structure comprises a first electrode; a second electrode; and a mechanically movable sensing element disposed intermediate the first and second electrodes and adapted to vertically oscillate between the first and second electrodes, the sensing element comprising a FinFET structure having a height and a width, the height being greater than the width.

In an embodiment, a micromachine structure comprises a positive electrode; a plurality of positive fins integrally fabricated with the positive electrode and each cantilevered from the positive electrode at a first longitudinal end; a negative electrode arranged opposite the positive electrode; and a plurality of negative fins integrally fabricated with the negative electrode and each cantilevered from the negative electrode at a first longitudinal end, the plurality of negative fins interleaved with the plurality of positive fins, a capacitance of the structure related to a relative distance between each of the interleaved plurality of positive and negative fins.

In an embodiment, a method for fabricating a micromachine structure comprises forming a first electrode; forming a second electrode; and integrally forming a FinFET sensing element with the first and second electrodes in a FinFET fabrication process, the sensing element comprising a micromachine fin structure disposed intermediate the first and second electrodes and adapted to oscillate between the first and second electrodes.

In an embodiment, a method for fabricating a micromachine structure comprises forming a first electrode array; forming a second electrode array; forming a FinFET sensing fin between the first and second electrode arrays on a sacrificial layer by etching away the sacrificial layer while preserving the FinFET sensing fin; and providing a sealing for the micromachine structure, the sealing substantially enclosing the first and second electrode arrays and the sensing fin.

In an embodiment, a micromachine structure comprises a first FinFET electrode; and a second FinFET electrode spaced apart from the first FinFET electrode and adapted to mechanically move into and out of contact with the first FinFET electrode, the first and second FinFET electrodes comprising monocrystalline silicon fins each formed having a height greater than a width.

The above summary of the invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood from the following detailed description of various embodiments in connection with the accompanying drawings, in which:

FIG. 1 depicts a step of a process according to an embodiment of the invention.

FIG. 2 depicts a step of a process according to an embodiment of the invention.

FIG. 3 depicts a step of a process according to an embodiment of the invention.

FIG. 4 depicts a step of a process according to an embodiment of the invention.

FIG. 10 is a top view of an oscillator according to an embodiment of the invention.

FIG. 11 is a top view of an oscillator according to an embodiment of the invention.

FIG. 12 is a top view of an oscillator according to an embodiment of the invention.

FIG. 13A is a top view of an oscillator according to an embodiment of the invention.

Figure 6:
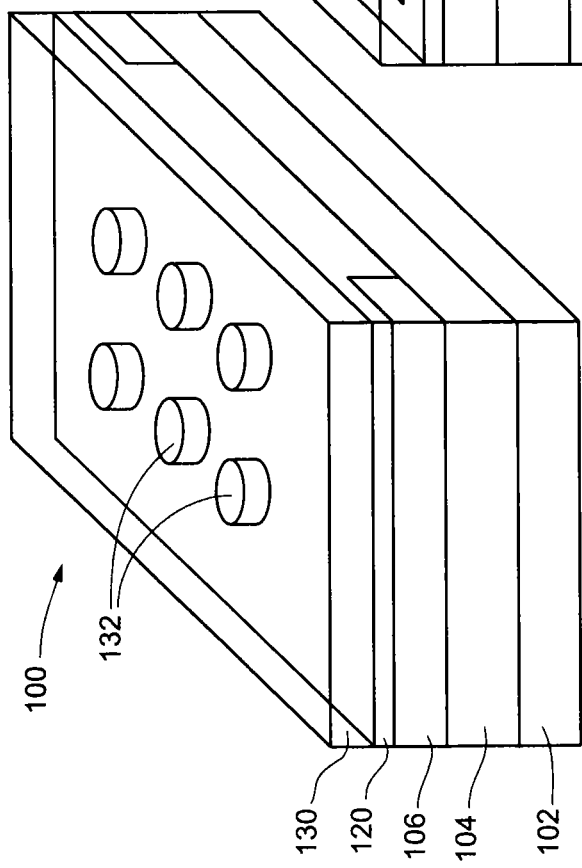
FIG. 6 depicts a step of a process according to an embodiment of the invention.
Figure 5:
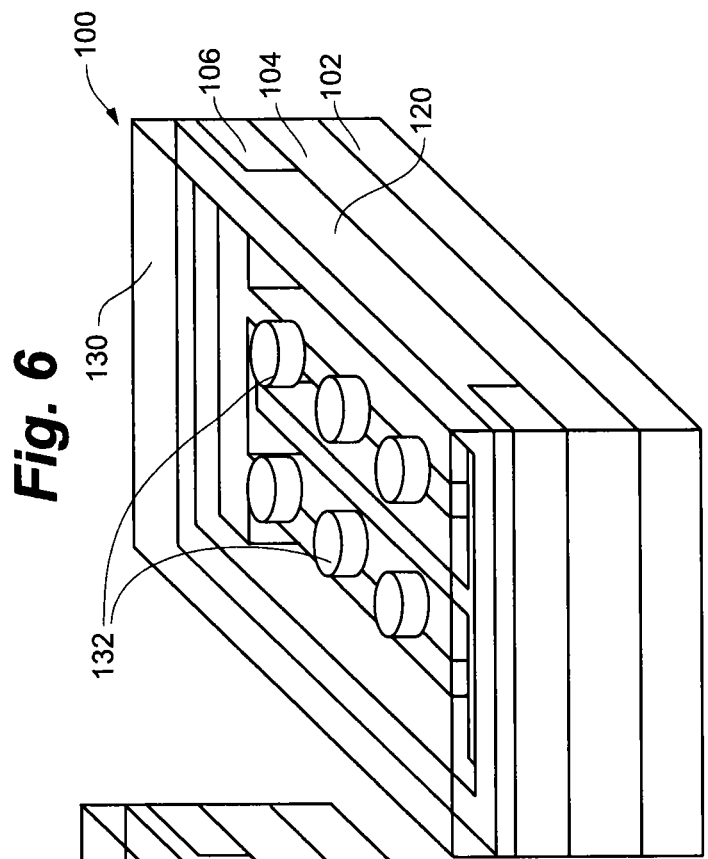
FIG. 5 depicts a step of a process according to an embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

Embodiments are related to micromachine structures and processes for producing micromachine structures. Structures according to various embodiments of the invention can provide full testability on-chip with in-use voltages, with fabrication and processing of the chip compatible with standard processes. The invention can be more readily understood by reference to FIGS. 1-17 and the following description. While the invention is not necessarily limited to the specifically depicted application(s), the invention will be better appreciated using a discussion of exemplary embodiments in specific contexts.

FIGS. 1-8 depict a fabrication process of a micromachine structure according to one embodiment of the invention. According to one embodiment of the invention, micromachine structures comprise sensor elements incorporating fin-type field effect transistor (FinFET) technology and comprising FinFET structures and can be produced as part of a FinFET fabrication process. As a result of the realization of integrated sensors and logic, large quantities of high quality devices can be cost-effectively manufactured in a standard CMOS fabrication facility, requiring no special equipment or disparate processes. Embodiments of the invention are also related to the use of monocrystalline silicon in the fabrication process.

In FIG. 1, the process can begin with a silicon on insulator (SOI) layered silicon-oxide-silicon substrate 100 in one embodiment. Substrate 100 can include a bulk-Si layer 102, a buried oxide layer 104, and a Si layer 106 in various embodiments, and in one embodiment layer 104 can have a thickness of about 150 nm and layer 106 about 90 nm.

In FIG. 2, fins 110 are formed in Si layer 106. In one embodiment, the width and pitch of fins 110 are less than about 100 nm. This small size, in addition to the narrow width of the final structure, makes possible small deflections of large sensor signals. The structure also provides improved mechanical characteristics, with increased robustness as a result of low mechanical sensitivity. Improved mechanical characteristics can also be provided in various embodiments through the use of monosilicon as layer 106.

In FIG. 3, a sacrificial oxide fill layer 120 is added and planarization is carried out.

Next, in FIG. 4, a cavity mask layer 130 is added. Layer 130 can comprise polysilicon (poly-Si). In one embodiment, layer 130 has a thickness of about 100 nm. In the step depicted in FIG. 5, a cavity mask 132 is structured in layer 130.

In FIG. 6, the step of cavity corrosion is depicted. Cavity corrosion exposes fins 110 through oxide fill layer 120.

Figure 8:
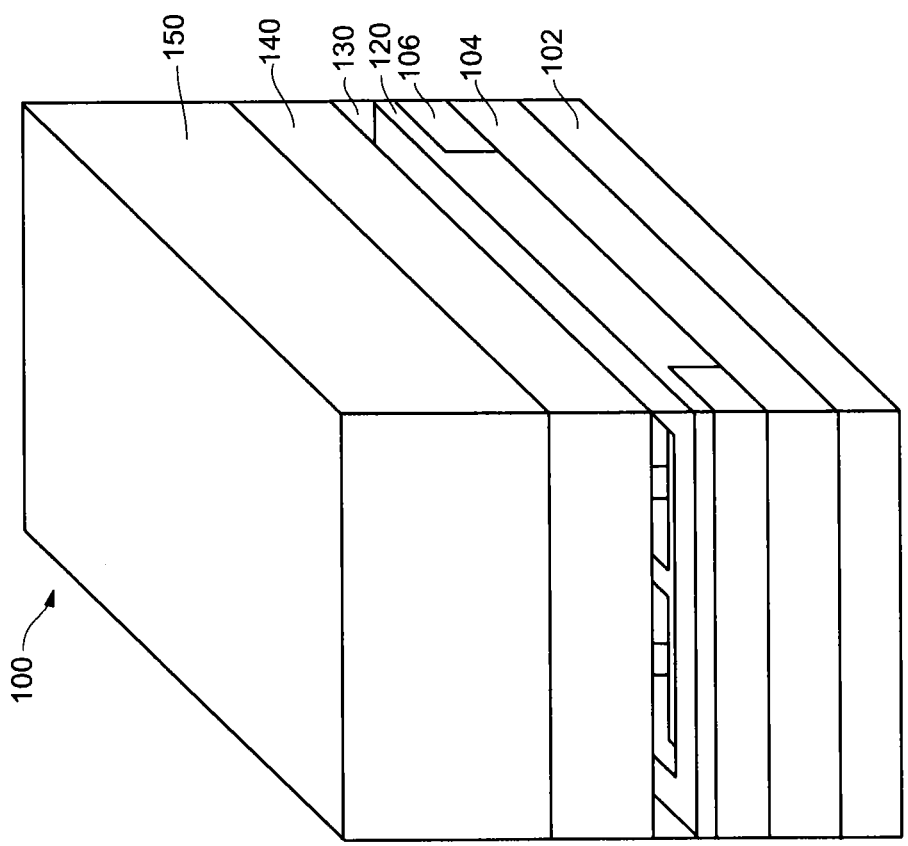
FIG. 8 depicts a step of a process according to an embodiment of the invention.
Figure 7:
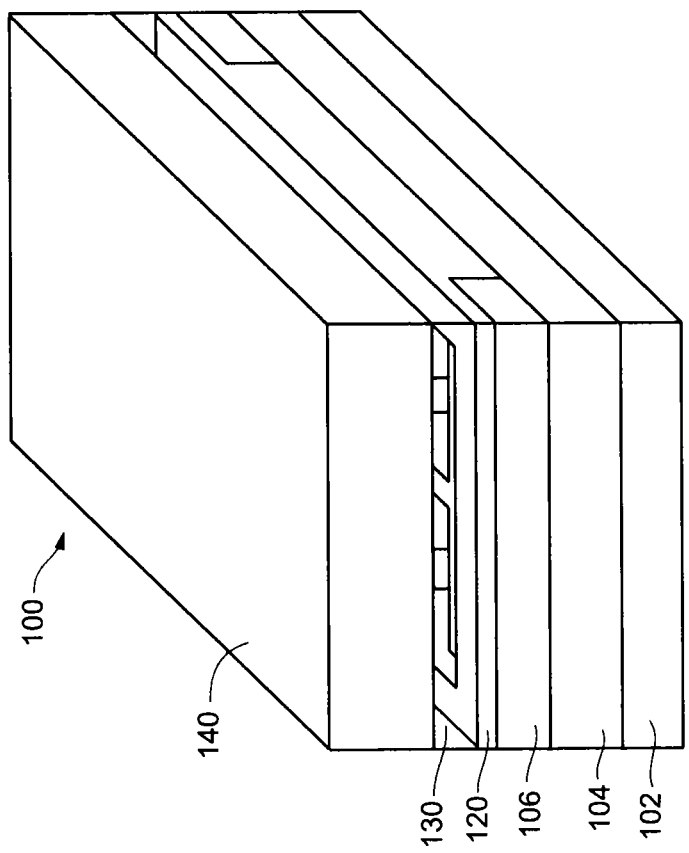
FIG. 7 depicts a step of a process according to an embodiment of the invention.
Figure 9:
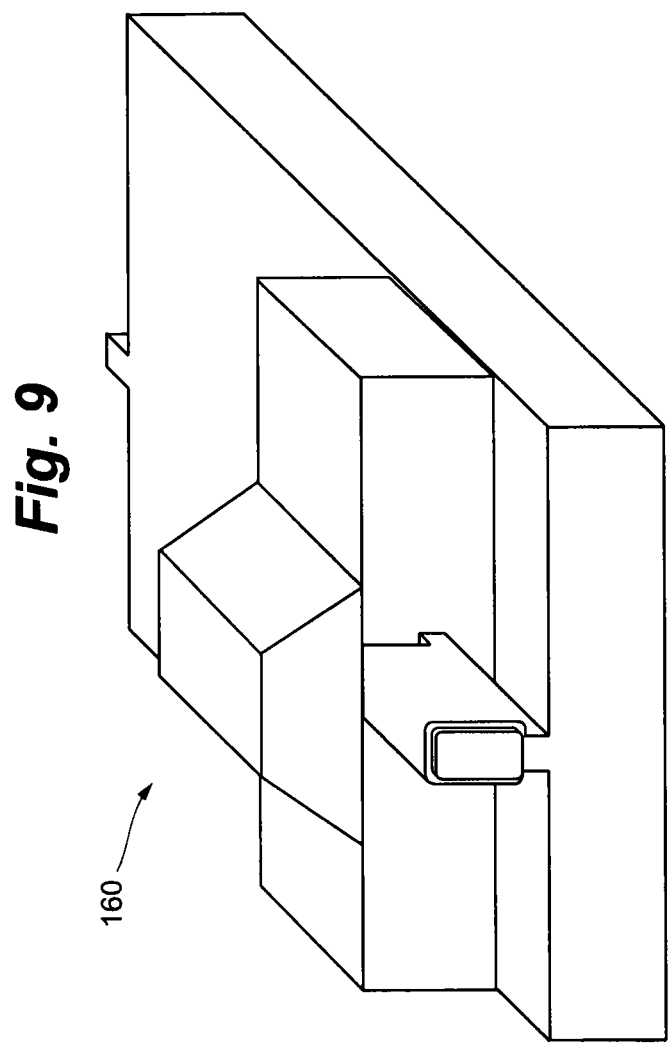
FIG. 9 depicts a device according to an embodiment of the invention.

A cavity sealing step is depicted in FIG. 7. In this step, an oxide-sealing layer 140 is added over cavity layer 130. Metallization and passivation steps are then carried out, as depicted in FIG. 8, adding layer 150.

According to embodiments of the fabrication process described above with reference to FIGS. 1-8, logic transistor structures and sensor structures can be manufactured together, providing cost-effective integrated sensor and logic elements. The logic can provide minimum structures in the sub-100 nanometer (nm) range and has advantages for sensor integration, with respect to both cost over high integration of several sensors and the technical performance of the individual sensors. Further, the dimensions of the structures make possible sensor actuation with low voltages, compatible with customary CMOS technologies. Small dimensioning also makes possible robust mechanical structures with crucial advantages during the subsequent processing. One embodiment of a parallel-manufactured transistor 160 in depicted in FIG. 9.

Additionally, embodiments of the invention have reduced area requirements for sensor structures with improved testability, as electrostatic tests with available voltages are possible in a less than about 5V application area. Embodiments of the invention also facilitate development of new application ranges, which presuppose elements with minimum structure sizes, such as elements with low current consumption by low voltages, oscillators with high frequency, and the like. Examples include inertia sensors, capacitive and piezoresistive; acceleration sensors; gyrometers; PROM devices realized with cavity fuses; resonators; and variable capacitors, among others.

Examples of inertia sensors, resonators, and other devices will be described with reference to FIGS. 10-17, which depict embodiments of a mechanical oscillator according to the invention.

Referring to FIG. 10, one embodiment of a mechanical oscillator 200 according to the invention comprises a movable bar element 202, a first electrode element 204, and a second electrode element 206. Oscillator 200 further comprises a free corrosion area 208 in which movable bar element 202 is disposed. Bar element 202 is adapted to laterally or transversely oscillate with respect to first electrode element 204 and second electrode element 206. First and second electrode elements 204 and 206 can be gate electrodes, and although first electrode element 204 is depicted as having a negative polarity, and second electrode element 206 positive, the polarities can be reversed in other embodiments, as understood by those of skill in the art. In other embodiments, one of first electrode element 204 and second electrode element 206 can comprise an energizing electrode and the other can comprise a sensor element.

FIG. 11 depicts another embodiment of an oscillator 210. Oscillator 210 comprises movable element 212 having a dual bar, or tuning fork-like, geometry. Similar to oscillator 200 depicted in FIG. 10, movable element 212 is disposed in a free corrosion area 218 between a first electrode element 214 and a second electrode element 216. The tuning fork geometry of element 212 can provide a stable and higher quality oscillator.

In FIG. 12, an oscillator 220 comprises a weighted movable element 222. Similar to other embodiments, weighted movable element 222 of oscillator 220 is disposed intermediate first and second electrode elements 224 and 226 in a free corrosion area 228.

As depicted, weighted movable element 222 comprises a mass 223 at a distal end. In other embodiments, weighted movable element 222 can comprise alternate mass configurations, including alternate mass positions relative to proximate and distal portions of element 222 or tapering or expanding geometries. These and other various configurations of weighted movable element 222 provide control of the frequency of oscillation of oscillator 220 and therefore can be selected or tailored for particular applications and specifications.

Figure 13B:
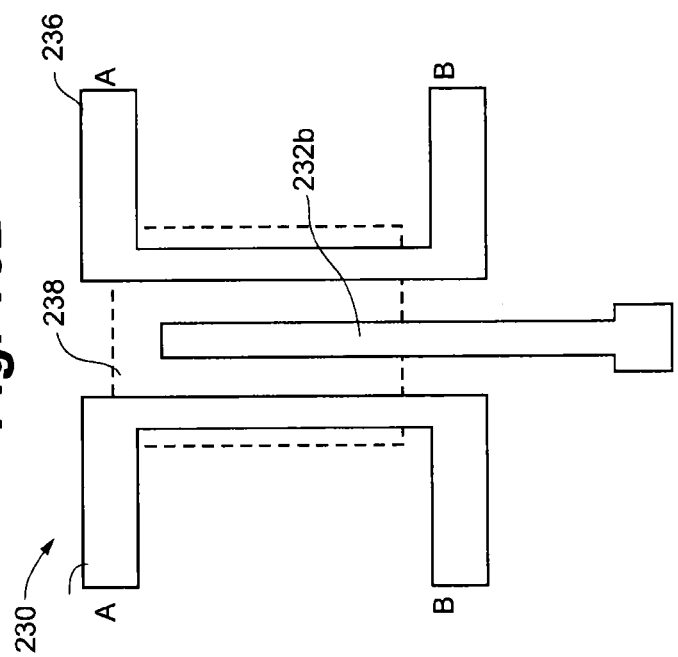
FIG. 13B is a top view of an oscillator according to an embodiment of the invention.

FIGS. 13A and 13B depict further embodiments of mechanical oscillators according to the invention, in which gate electrodes 234 and 236 of oscillator 230 are also free corroded, at 238. Additionally, gate electrodes 234 and 236 can be doubly mounted at A and B, respectively, in contrast to embodiments previously depicted and described.

Further, dimensioning of movable element 232 can be varied, as depicted at 232a in FIG. 13A and at 232B in FIG. 13B. The dimensions of movable element 232, such as the length, can be varied according to a placement of moveable element 232 relative to energizing electrodes 234 and 236, for example. Additionally, a via hole of oscillator 230 can be placed beneath electrodes 234 and 236 to facilitate minimum fin pitch.

Figure 14A:
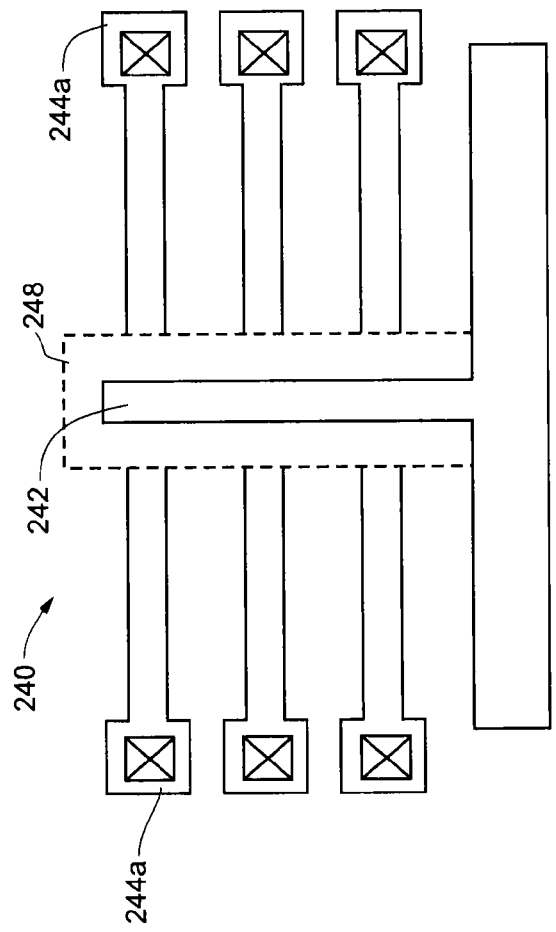
FIG. 14A is a top view of an oscillator according to an embodiment of the invention.
Figure 14B:
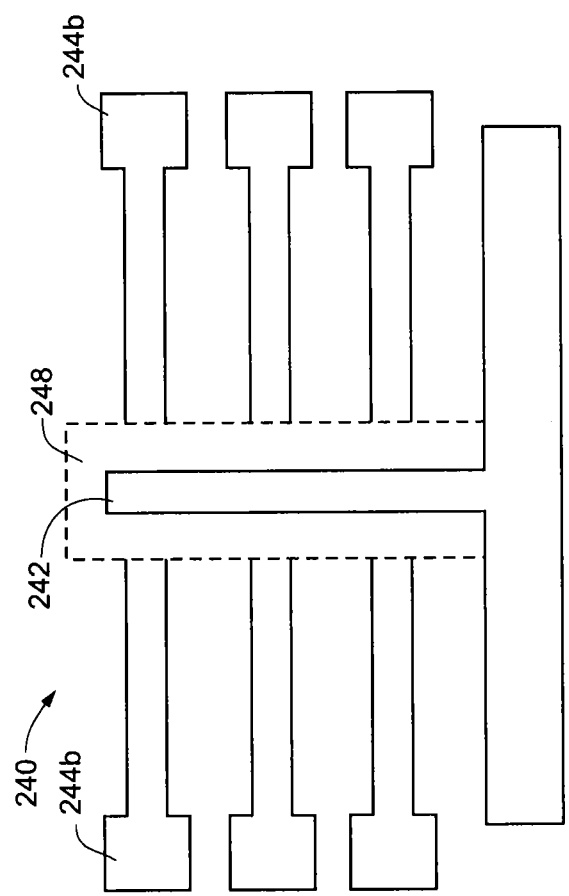
FIG. 14B is a top view of an oscillator according to an embodiment of the invention.

Referring to FIGS. 14A and 14B, an embodiment comprising additional electrodes can provide higher harmonious oscillations. An oscillator 240 comprises an oscillator element 242 disposed intermediate a plurality of fin-structured gate electrodes 244a. Electrodes 244a are orthogonally arranged in a 2.times.3 configuration relative to oscillator element 242 and corroded region 248 in the embodiment depicted, although other configurations are also possible.

In FIG. 14B, a similar configuration in another embodiment comprises poly-silicon or metal gate electrodes 244. This embodiment additionally provides the orthogonal orientation that can transfer to existing transistors.

Figure 15:
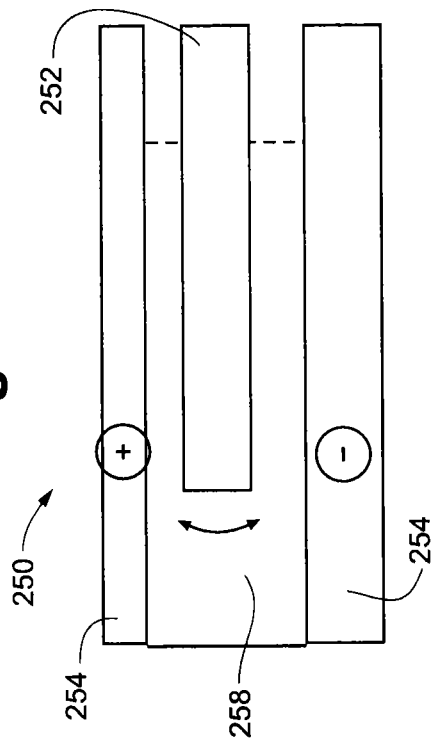
FIG. 15 is a section view of an oscillator according to an embodiment of the invention.

A vertical configuration of an oscillator 250 according to an embodiment of the invention is depicted in FIG. 15. Such a configuration captures vertical movement of movable element 252 by energizing electrodes 254. As in other embodiments, the polarities of electrodes 254 can also be reversed.

Figure 16:
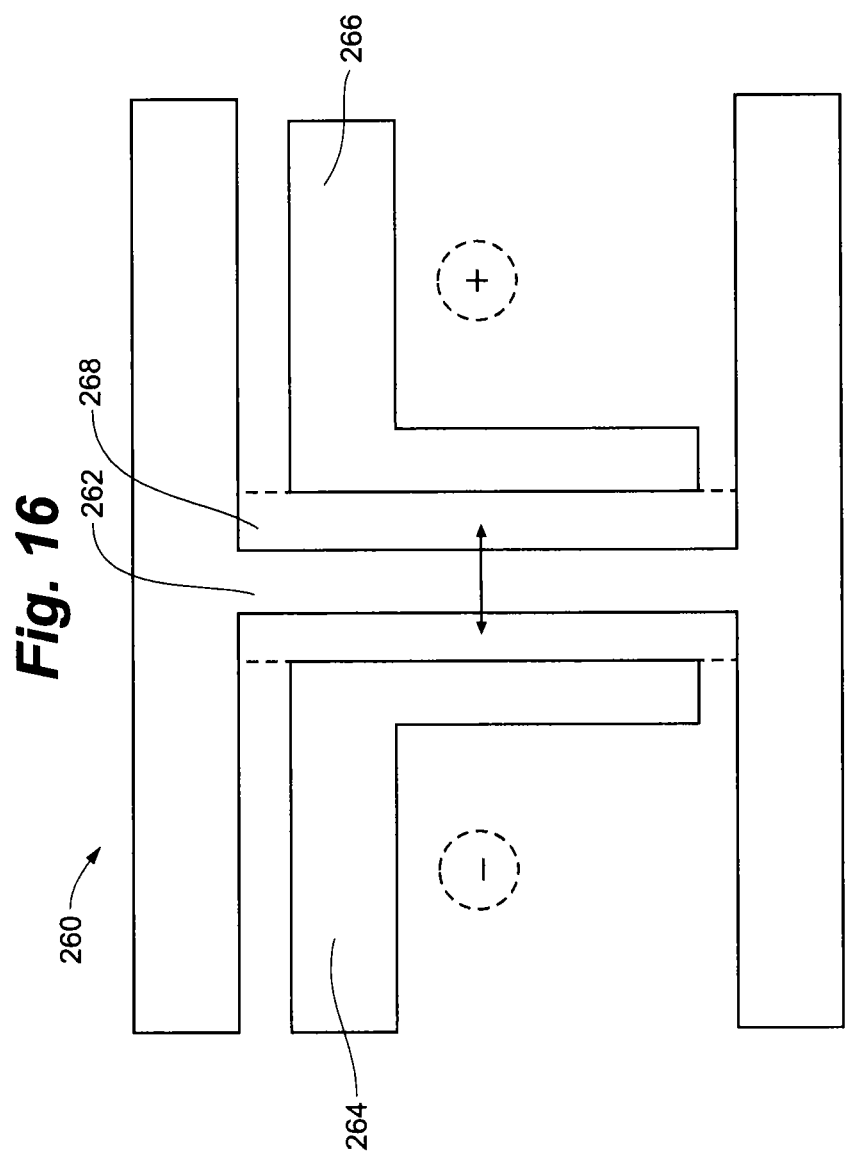
FIG. 16 is a top view of an oscillator according to an embodiment of the invention.

Another embodiment of an oscillator 260 shown in FIG. 16 can be used to capture higher frequency oscillations. Oscillator 260 comprises a movable fin element 262 mounted at first and second ends in a corroded area 268 between first and second energizing electrodes 264 and 266. High frequency oscillations of an intermediate portion of element 262 are registered by electrodes 264 and 266.

Figure 17:
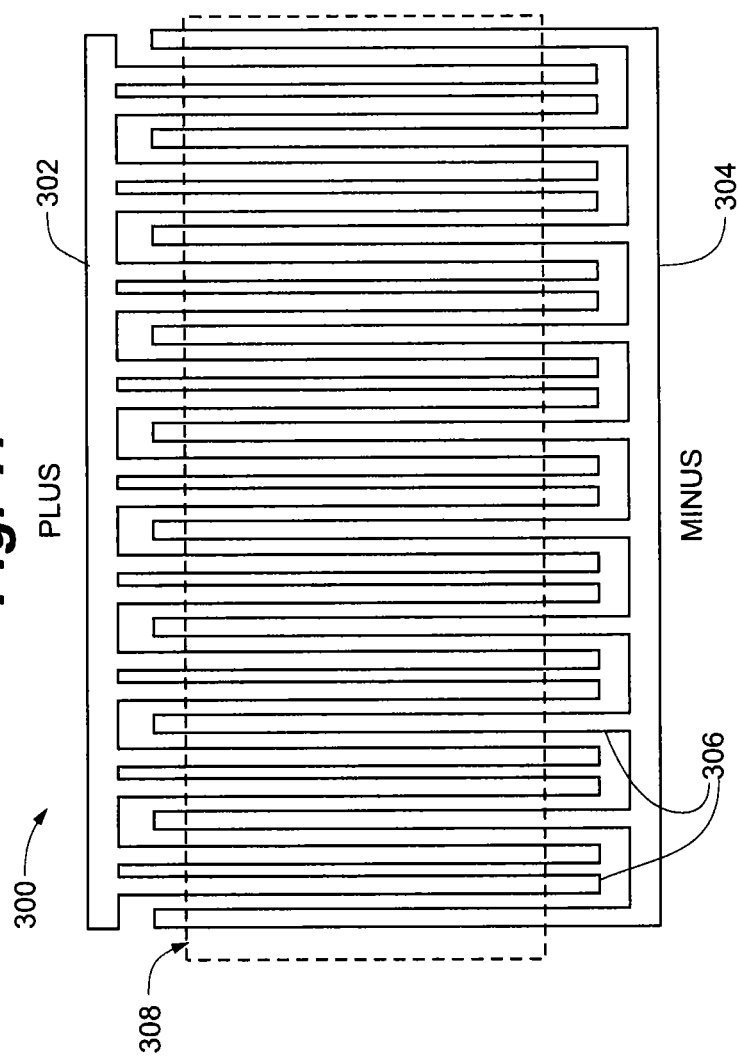
FIG. 17 is a top view of a variable capacity structure according to an embodiment of the invention.

FIG. 17 depicts a variable capacitance structure 300, such as an electrostatically adjustable capacitance varactor diode. Structure 300 comprises a positive portion 302 and a negative portion 304, although the polarities of portions 302 and 304 can be reversed in other embodiments. A plurality of cantilevered fins 306 are disposed between both and respectively coupled to one of portions 302 and 304, relative to a clearance hole 308.

In structure 300, an overall capacitance is altered by creation of a tension affecting fins 306 and therefore structure 300, wherein a relative distance between fins 306 affects the capacitance. The resultant capacitance can be expressed as $e_0 \times e_r \times A/D$, such that small changes are registered exponentially. In one embodiment, this effect can be improved by coating fins 306 with a material having a high $e_r$.

One advantage of this embodiment is its breakdown voltage, which can be in the range of greater than 10V. Further, an activation voltage of structure 300 can be between about 2V and about 3V, with attainable capacitances in the nano-Farad (nF) range and a difference between maximum and minimum capacitances of about 3 to 4.

Various combinations of the embodiments depicted in FIGS. 10-17 are also possible according to the invention. The fins in various embodiments can comprise pure silicon, heavily doped silicon, and/or silicidized silicon. If the CMOS process includes reduction of Ohmic resistance for the reduction of the resistances in transistor connection areas before the growth of the epitaxial silicon, this process step can be blocked by a special mask, since thereby the geometrical dimensions of the mechanical oscillator would change with respect to the corroded fin structure.

In another embodiment, a micromachine structure according to the invention comprises two electrodes. One or both of the electrodes are adapted to mechanically move into and out of contact with the other electrode. Each of the electrodes can comprise a FinFET structure having a height greater than a width in one embodiment, and the FinFET structures can comprise silicon, such as monocrystalline silicon. In this and other embodiments described herein, the FinFET structures can be formed as part of a standard FinFET fabrication process on bulk or oxide, such as a buried oxide, and can be formed on a sacrificial layer which can be etched away while preserving the FinFET structures.

Embodiments of the invention are thus related to the use of monocrystalline silicon in the fabrication of micromachine structures, such as sensor elements, produced in a CMOS multi-gate technology, such as FinFET. Use of FinFET processes, for example, provides advantages not available with traditional micromachining processes. The invention can provide smaller but more robust mechanical and electrical structures capable of handling in-use test voltages, the result of which are high-quality structures which are easily fabricated, processed, sealed and packaged, and tested. For example, smaller micromechanical structures according to embodiments of the invention require smaller voltages, enabling the structures to be integrated in test procedures at in-use voltages less than about 5 V, such as about 2V to about 4V in various embodiments. The smaller structures, in one embodiment, can reduce a gap requirement for the sensing or oscillating fin from about 0.5 um to less than about 100 nm, for example about 20 nm to about 60 nm. In other embodiments, the gap can be less than about 20 nm, for example about 15 nm, with the area requirement correspondingly being reduced by a factor of about 10. The smaller structures, however, are still more robust, providing reasonable signals with only small deformations.

Although specific embodiments have been illustrated and described herein for purposes of description of an example embodiment, it will be appreciated by those of ordinary skill in the art that a wide variety of alternate and/or equivalent implementations calculated to achieve the same purposes may be substituted for the specific embodiments shown and described without departing from the scope of the present invention. Those skilled in the art will readily appreciate that the invention may be implemented in a very wide variety of embodiments. This application is intended to cover any adaptations or variations of the various embodiments discussed herein, including the disclosure information in the attached appendices. Therefore, it is manifestly intended that this invention be limited only by the claims and the equivalents thereof.

What is claimed is:

1. A method for fabricating a micromachine structure comprising:
   forming a first electrode;
   forming a second electrode; and
   integrally forming a FinFET sensing element with the first and second electrodes in a FinFET fabrication process, the sensing element comprising a micromachine fin structure disposed intermediate the first and second electrodes and adapted to oscillate between the first and second electrodes.

2. The method of claim 1, further comprising testing the micromachine structure using in-use voltages.

3. The method of claim 1, further comprising activating the sensing element with a voltage of less than about 5 V.

4. The method of claim 1, wherein forming the first and second electrodes is carried out such that a gap between the first and second electrodes is about 20 nm to about 60 nm.

5. A method for fabricating a micromachine structure comprising:
- forming a first electrode array;
- forming a second electrode array;
- forming a FinFET sensing fin between the first and second electrode arrays on a sacrificial layer by etching away the sacrificial layer while preserving the FinFET sensing fin; and
- providing a sealing for the micromachine structure, the sealing substantially enclosing the first and second electrode arrays and the sensing fin.

* * * * *